United States Patent
Morris, Jr. et al.

(10) Patent No.: US 6,326,844 B1
(45) Date of Patent: Dec. 4, 2001

(54) AMPLIFIER APPARATUS WITH TRANSIENT RECOVERY AID

(75) Inventors: Robert Edward Morris, Jr.; Alan Anderson Hoover, both of Indianapolis, IN (US)

(73) Assignee: Thomson Licensing SA, Boulogne Cedex (FR)

( * ) Notice: Subject to any disclaimer, the term of this patent is extended or adjusted under 35 U.S.C. 154(b) by 0 days.

(21) Appl. No.: 09/806,535

(22) PCT Filed: Dec. 17, 1998

(86) PCT No.: PCT/US98/26811

§ 371 Date: Mar. 29, 2001

§ 102(e) Date: Mar. 29, 2001

(87) PCT Pub. No.: WO00/21192

PCT Pub. Date: Apr. 13, 2000

Related U.S. Application Data
(60) Provisional application No. 60/102,774, filed on Oct. 2, 1998.

(51) Int. Cl.$^7$ .................................................. H03F 1/26
(52) U.S. Cl. ...................... 330/149; 330/207 P; 330/297; 381/94.5
(58) Field of Search .................................... 330/149, 297, 330/207 P, 298; 381/94.1, 94.2, 94.3–94.9, 120, 121

(56) References Cited

U.S. PATENT DOCUMENTS

| 3,947,636 | * | 3/1976 | Edgar | 179/1 P |
|---|---|---|---|---|
| 4,405,948 | | 9/1983 | Griffis | 358/198 |
| 5,157,353 | | 10/1992 | Lendaro | 330/297 |
| 5,199,079 | | 3/1993 | Anderson et al. | 381/94 |
| 5,224,169 | | 6/1993 | Morris, Jr. et al. | 381/55 |
| 5,751,822 | * | 5/1998 | Yamaguchi et al. | 381/94.1 |
| 5,796,850 | * | 8/1998 | Shiono et al. | 381/94.1 |
| 6,172,561 | * | 1/2001 | Schott | 330/86 |

OTHER PUBLICATIONS

Herbert Sax "HIFI IM Fernsehgerat Anspruch Oder Wirklichkeit" Funkschau, No. 25/26, 1981 pgs. 65–67.

R.W.J. Barker et al "Gate–Circuit Protection Safeguards MOSFET Amplifier" Electronic Engineering, vol. 44, No. 527, Jan. 1972 pgs 31–32.

"Power Amplifier (Buffer) with Low Output Impedance and Current Measurement Capability" IBM Technical Disclosure Bulletin, vol. 30, No. 7, Dec. 1987, pp. 95–97.

* cited by examiner

Primary Examiner—Robert Pascal
Assistant Examiner—Henry Choe
(74) Attorney, Agent, or Firm—Joseph S. Tripoli; Kuniyuki Akiyama

(57) ABSTRACT

A "floating" or "unipolar" DC supply is coupled to a filter comprising a pair of capacitors coupled in series across the supply output. Output voltages developed across the capacitors are applied to the supply inputs of an amplifier having an output coupled via a load to a common connection of the two capacitors. A bias supply, coupled in parallel with the filter, produces an output voltage representative of the relative values of the capacitor voltages which is fed back to an input of the amplifier via a threshold device. Under transient input signal conditions, which would tend to unbalance the filter capacitor voltages, the bias supply renders the threshold device conductive for diverting the transient from the amplifier input thus reducing the supply voltage imbalance and improving the transient recovery time of the amplifier.

8 Claims, 1 Drawing Sheet

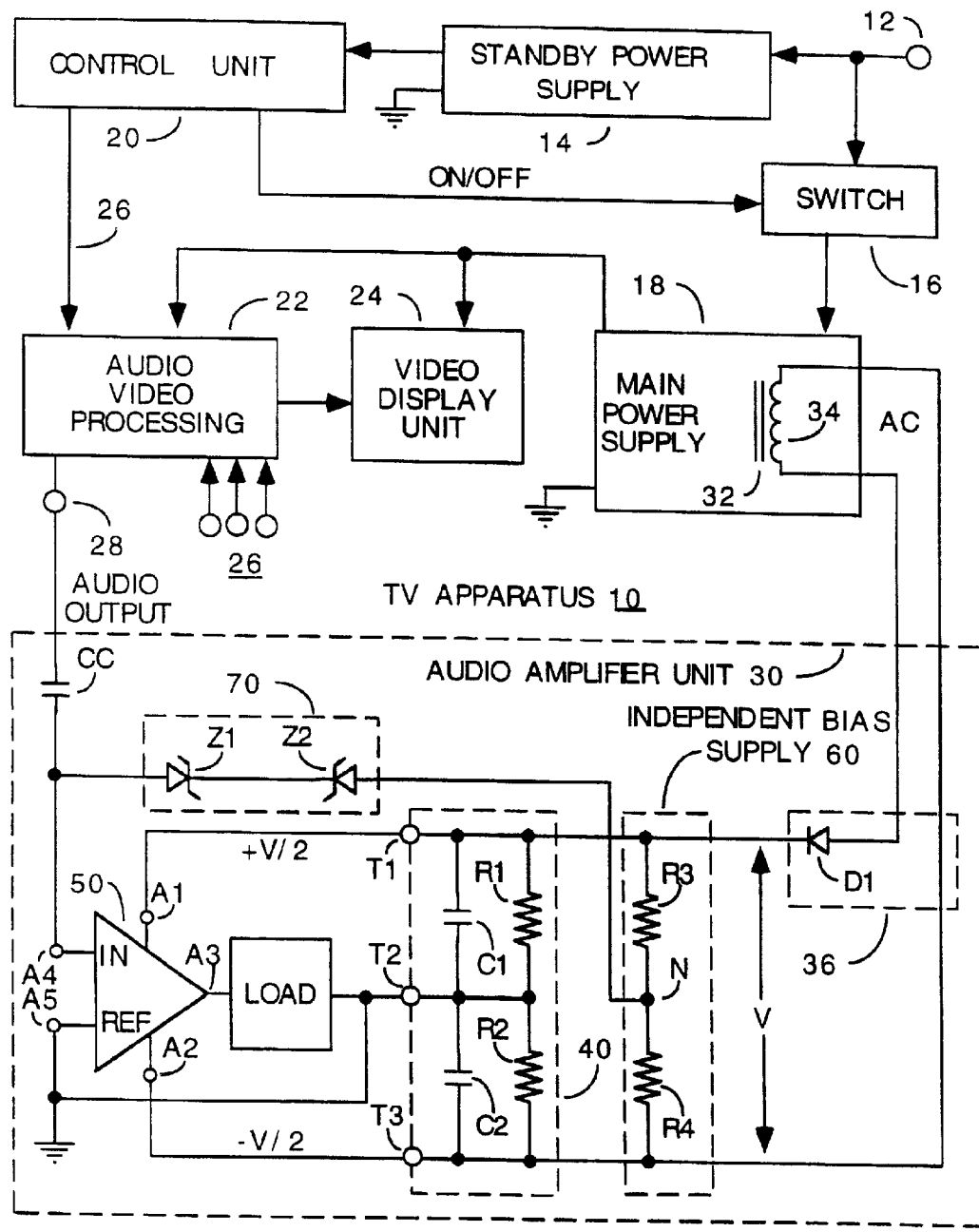

AMPLIFIER APPARATUS WITH TRANSIENT RECOVERY AID

This application claims the benefit of U.S. provisional application Ser. No. 60/102,774 filed Oct. 2, 1998, which is hereby incorporated herein by reference, and which claims the benefit under 35 U.S.C. § 365 of International Application PCT/US98/26811, filed Dec. 17, 1998, which was published in accordance with PCT Article 21(2) on Apr. 13, 2000 in English.

FIELD OF THE INVENTION

This invention relates to amplifiers having provisions for reducing recovery time for transient operating conditions and particularly to transient suppression circuitry for reducing the effect of transients which may accompany the input signal to an amplifier.

BACKGROUND INFORMATION

Various methods are known for protecting an audio amplifier from transient effects. As an example, Morris, Jr. et al. in U.S. Pat. No. 5,224,169 describes a system including stereo amplifiers, each supplied with dual supply voltages (+V and −V). A detector, coupled to the amplifier outputs, senses the amplifier output voltage and turns off the positive and negative supplies if sustained DC is present or if either supply fails. Brief DC transients (i.e., not "sustained") which may accompany the input signal may not be sensed. Lendaro, in U.S. Pat. No. 5,157,353 describes a protection circuit wherein the dual power supplies of an operational amplifier are provided with "slow start" circuitry which limits the rate of change of the supply voltages to suppress turn-on/turn-off transients. There is no provision, however, for suppressing transients which may accompany the input signal.

Other examples of amplifier protection circuits are described, for example, by Griffis in U.S. Pat. No. 4,405,948 in which supply voltage transients are detected and used for reducing the gain of a variable gain amplifier preceding an audio amplifier. In U.S. Pat. No. 5,199,079 Anderson et al. describe an arrangement including an amplifier having bias and supply voltages obtained from diode isolated filters that reduce the voltages slowly when the main voltage supply is de-energized.

SUMMARY

The present invention resides, in part, in the discovery of a heretofore unrecognized problem regarding transient effects which may occur in certain types of amplifiers. Specifically, in certain amplifier applications there may be only a uni-polar power supply available for operation of an amplifier normally requiring a bi-polar supply (as described in detail later). It has been found, in accordance with an aspect of the invention, that in such applications an input signal transient may result in a condition wherein the voltages of power supply filter capacitors may be disturbed by transients accompanying the amplifier input signal and this disturbance may degrade the amplifier transient response.

It is an object of the invention, to reduce the effect of input signal transients on the supply voltages of an amplifier.

Amplifier apparatus embodying the invention comprises a filter including first and second capacitors coupled in series across the outputs of a DC supply. Output voltages developed across the capacitors are applied to respective supply terminals of an amplifier which has an output coupled to a common connection of the two capacitors via a load. A feedback circuit is provided for suppressing transients at an input of the amplifier in response to an unbalanced condition of the output voltages of the filter.

In an exemplary application of the principles of the invention, the feedback circuit comprises a bias supply having an output providing a bias voltage indicative of a difference in the capacitor voltages and a threshold device coupled between the output of said bias supply and the input of the amplifier.

BRIEF DESCRIPTION OF THE DRAWING

The foregoing and further aspects of the invention are shown in the accompanying drawing, wherein the sole FIGURE is a circuit diagram, partially in block form, of a television apparatus including an audio amplifier unit embodying the invention.

DESCRIPTION OF THE PREFERRED EMBODIMENT

The television apparatus 10 of FIG. 1 includes a power input terminal 12 coupled to a standby power supply 14 and coupled via a switch 16 to a main power supply 18. The standby power supply 14 continuously supplies operating power to a control unit 20 which may include a remote control receiver. Upon receipt of a turn-on command by a users remote control transmitter, the control unit sends a turn-on signal to switch 16 which activates the main power supply 18 which, in turn, supplies operating power to an audio/video signal processing unit 22 and to a video display unit 24 coupled to an output of the audio/video signal processing unit 22. Unit 22 has a plurality of audio/video inputs 26 and may include a tuner and other conventional audio/video signal processing circuits. Control unit 20 is responsive to user inputs for providing channel selection signals, input selection signals and various other control signals (e.g., volume, color, tint, etc.) via a bus 26 to the audio/video processing unit 22 which, in turn, provides a video signal to the display unit 24 and an audio output signal to audio output terminal 28 for amplification and application to a speaker by an audio amplifier unit 30 (outlined in phantom) embodying the invention. To simplify the drawing, only a single audio output terminal 28 and amplifier unit 30 are shown which would be suitable for monaural sound applications. For stereo applications, a second audio output terminal would be provided and a second audio amplifier unit.

The main power supply 18 is preferably of the switching mode type to provide high efficiency generation of DC voltages for units 22 and 24 as well as a source of AC power for operating the audio amplifier unit 30. Specifically, supply 18 includes a transformer 32 having windings (not shown) for generation of various voltages for the processing and display units 22 and 24. As shown, the transformer 32 also has a secondary winding 34 for providing AC power to unit 30. It will be noted that the secondary winding 34 is a single winding without a center tap and is "floating" (i.e., not grounded) within the main power supply unit 18.

DC power for the audio amplifier unit 30 is provided by a rectifier unit 36 comprising a diode D1 in series with the AC supply line from power supply 18 which rectifies the AC power and produces a DC output voltage V which is applied to first (T1) and third (T3) terminals of a filter 40 for smoothing the rectified voltage and for converting the uni-polar voltage V to bi-polar form. More specifically, filter 40 comprises a pair of capacitors C1 and C2 coupled in series across terminals T1 and T3 to which the rectified voltage V is applied and a third terminal connected to a common connection of the capacitors whereby a positive voltage +V/2 is produced at terminal T1 relative to terminal T2 and a negative voltage −V/2 is produced at terminal T3 relative to terminal T2. A pair of resistors R1 and R2 are provided in parallel with respective ones of capacitors C1 and C2 for stabilizing the filter output impedance and setting the filter time constant as well as for providing uniform capacitor discharge when the AC power is switched off. Exemplary values for filter capacitors C1 and C2 are 1000 micro-Farads and exemplary values for filter load resistors R1 and R2 are 250 Ohms each.

The output voltages +V/2 and −V/2 are developed across the capacitors C1 and C2 are coupled to respective supply terminals A1 and A2 of an amplifier 50 which has an output terminal A3 coupled via a load 52 (e.g., a loud speaker voice coil) to the common connection of the pair of capacitors (i.e., to terminal T2). A preferred amplifier for use as amplifier 50 is the type TDA7480 class "D" audio amplifier manufactured by ST Microelectronics, Inc. The DC reference input terminal A5 of amplifier 50 is coupled to filter output terminal T2 and, in this example of the invention, is also coupled to the TV apparatus 10 system ground. As shown and described later, any terminal of the filter 40 may be referenced to the system ground. The signal input terminal A4 of amplifier 50 (which is the non-inverting input in this example) is AC coupled via a coupling capacitor CC to the audio output terminal 28 of processing unit 22.

DC transients may accompany the audio input signal when, for example, the main power supply 18 is turned on or off. Such transients may also occur, illustratively, when a user changes connections to the inputs 26 of the audio/video processor 22 or they might occur when unit 22 switches between different audio sources coupled to inputs 26.

In accordance with an aspect of the invention, it is herein recognized that DC transients accompanying the audio input signal may have the effect of un-balancing the filter capacitor voltages and such an unbalanced condition may undesirably lengthen the time necessary for the transient to decay and for amplifier 50 to recover. As an example, a positive DC transient relative to the voltage at terminal A5 can cause amplifier 50 to demand more current from capacitor C1 than from capacitor C2 thus un-balancing the capacitor voltages. This is particularly likely to happen when the time constant of the DC transient is greater than the time constant of the filter 40.

In accordance with the invention, DC transients accompany the input signal applied to amplifier 50 are suppressed by means of a feedback circuit which is activated when an unbalanced condition of the capacitor voltages occurs.

The feedback circuit comprises a bias supply 60 which is independent of operation of amplifier 50. Independent bias supply 60 is coupled in parallel with the filter 40 and has an output node N coupled via a threshold device 70 to the amplifier 50 input terminal A4. The independent bias supply 60 comprises a pair of equal valued resistors R3 and R4 coupled from node N to filter terminals T1 and T3. Exemplary values for the resistors R3 and R4 are 4.7 K-Ohms, respectively. The threshold device 70 comprises a pair of equal valued Zener diodes Z1 and Z2 which are coupled "back-to-back" in series between node N of bias supply 60 and the signal input terminal A4 of amplifier 50. An exemplary value for the Zener voltage of diodes Z1 and Z2 is 5.6 Volts. This voltage is sufficiently higher than the expected peak input signal voltage at terminal A4 to normally prevent the Zener diodes from conducting so that the feedback path is open under normal signal conditions and diodes Z1 and Z2 are only conductive when transients occur for diverting the transient input signal energy to node N of the independent bias supply 60. Another way to look at this operation is that node N provides a current to input terminal A4 for suppressing or canceling transients when transients occur.

As a further example of operation of amplifier unit 30, when transients are not present the voltages across capacitors C1 and C2 will be equal since equal currents will be drawn from both by amplifier 50. Accordingly, the voltage at the common connection of the capacitors (terminal T2) will be equal to the voltage at node N produced by bias supply 60. Under these conditions Zener diodes Z1 and Z2 will be nonconductive since, as noted previously, the Zener voltage is greater than the maximum value of the expected audio input signal.

When a positive transient occurs, having a duration longer than the filter time constant, amplifier 50 will tend to discharge capacitor C1 more than capacitor C2 because of the greater current demand at its positive supply terminal A1. Since bias supply 60 averages the voltages across the filter, the reduced voltage across capacitor C1 will cause the node N voltage to become negative with respect to the voltage at terminal T2 (ground) thereby turning Zener diodes Z1 and Z2 on and diverting the transient input current to node N (i.e., supplying a current from node N to terminal A4 for suppressing or canceling the transient) thereby reducing the amplitude of the transient and speeding up recovery from the transient by amplifier 50. The same effect occurs for negative input transients wherein the node N voltage becomes positive with respect to terminal T2 due to the greater discharge of capacitor C2.

Various modifications may be made to the audio amplifier of FIG. 1. For example, the single diode rectifier 36 may be replaced by a full wave bridge rectifier. This would be advantageous in applications where the preferred switching mode supply is replaced by a non-switched supply providing a lower frequency AC signal for the audio unit 30. Also, with minor modifications, the non-inverting amplifier 50 may be replaced by an inverting amplifier. The system ground reference may be coupled to either of terminals T1 or T3 of the filter 40 rather than to terminal T2.

What is claimed is:

1. Transient recovery arrangement, comprising:
   an amplifier;
   a source of DC voltage for providing an operating voltage for said amplifier;
   a suppressing circuit coupled between said amplifier and said source of DC voltage including first and second storage means;
   said suppressing circuit coupled to an input of said amplifier provides a suppressing current during which the voltages developed at respective ones of said first and second storage means are unbalanced for suppressing a transient component of an input signal to said amplifier in proportion to a voltage difference between said first and second storage means; wherein said suppressing circuit further including at least one Zener diode.

2. Amplifier apparatus, comprising:
   a filter comprising a pair of capacitors coupled in series across first and second outputs of a DC supply;
   means coupling output voltages developed across said pair of capacitors to respective supply terminals of an amplifier;

means coupling an output of said amplifier to a common connection of said pair of capacitors via a load; and a feedback circuit coupled to an input of said amplifier for suppressing transient input signal components in proportion to a voltage difference between said two capacitors; wherein said feedback circuit further including at least one Zener diode.

3. Apparatus as recited in claim 2 wherein said feedback circuit means comprises:

a bias supply, coupled in parallel with said filter and having an output for providing an output voltage indicative of a difference in the capacitor voltages; and a threshold device coupled between said output of said bias supply and said input of said amplifier.

4. Amplifier apparatus, comprising:

a source of DC voltage;

a filter coupled to said source for providing a first output voltage between first and second terminals of said filter and for providing a second output voltage between said second terminal and a third terminal of said filter;

an amplifier having a first supply terminal coupled to said first terminal of said filter, having a second supply terminal coupled to said third terminal of said filter and having an output coupled via a load to said second terminal of said filter; and a feedback circuit, for suppressing transients at an input of said amplifier in response to an unbalanced condition of said output voltages of said filter; wherein said feedback circuit further including at least one Zener diode.

5. Apparatus as recited in claim 4 wherein said feedback circuit comprises:

a bias supply having respective inputs coupled to said first and third terminals of said filter and having an output coupled via a threshold device to said input of said amplifier.

6. Apparatus as recited in claim 4 wherein said bias supply comprises means for summing the voltages at said first and third terminals of said filter and wherein said threshold device is coupled between an output of said summing means to said input of said amplifier.

7. Apparatus as recited in claim 4 further comprising:

means coupling said second terminal of said filter to said reference voltage input of said amplifier.

8. Apparatus as recited in claim 7 further comprising:

means coupling a selected one of said second and third terminals of said filter to a source of ground reference potential.

\* \* \* \* \*